United States Patent [19]

Warfield

[11] Patent Number: 5,098,482
[45] Date of Patent: Mar. 24, 1992

[54] VERTICAL JUNCTION SOLAR CELL

[75] Inventor: Donald B. Warfield, Woodbine, Md.

[73] Assignee: Solarex Corporation, Rockville, Md.

[21] Appl. No.: 610,122

[22] Filed: Nov. 7, 1990

[51] Int. Cl.⁵ .............................................. H01L 31/06
[52] U.S. Cl. .................................. 136/259; 136/255; 136/256
[58] Field of Search ......................... 136/255, 256, 259

[56] References Cited

U.S. PATENT DOCUMENTS

| | | | |
|---|---|---|---|
| 3,985,579 | 10/1976 | Rahilly | 136/255 |
| 4,042,417 | 8/1977 | Kaplow et al. | 136/246 |
| 4,053,327 | 10/1977 | Meulenberg et al. | 136/256 |
| 4,072,541 | 2/1978 | Meulenberg et al. | 136/255 |
| 4,140,142 | 2/1979 | Dormidontov et al. | 136/246 |
| 4,332,973 | 6/1982 | Sater | 136/246 |
| 4,379,202 | 4/1983 | Chalmers | 136/256 |
| 4,493,942 | 1/1985 | Sheng et al. | 136/259 |
| 4,511,755 | 4/1985 | Mori | 136/246 |
| 4,644,091 | 2/1987 | Hayashi et al. | 136/259 |
| 4,711,972 | 12/1987 | O'Neill | 136/246 |

Primary Examiner—Aaron Weisstuch
Attorney, Agent, or Firm—Finnegan, Henderson, Farabow, Garrett & Dunner

[57] ABSTRACT

An improved vertical junction solar cell wherein the vertical junctions are formed by a plurality of grooves etched in the silicon wafer of the solar cell. The grooves define a plurality of walls having a top surface and side surfaces and a plurality of groove bottoms therebetween. In order to increase radiation resistance in such vertical junction solar cells, a focusing coverslide is provided which retracts or reflects incident light onto only the top surfaces of the walls and away from the grooved bottoms. It has been discovered that the majority of the radiation degradation in vertical junction solar cells occurs as a result of incident light impinging on the grooved bottoms, which are less resistant to radiation than are the top walls. Thus, the present invention provides a vertical junction solar cell with greatly increased radiation resistivity.

8 Claims, 2 Drawing Sheets

VERTICAL JUNCTION SOLAR CELL

BACKGROUND OF THE INVENTION

1. Field of the Invention

The present invention relates to solar cells for converting incident light into electricity and, more specifically, to vertical junction solar cells and to an improved structure thereof which reduces radiation degradation within the vertical junction solar cell.

2. Description of the Related Art

In a solar cell, light is absorbed at various depths from the top surface of the cell depending on the wavelength of the light impinging the cell. The impinging light needs to be absorbed within one diffusion length of the P-N junction. If the impinging light is not absorbed within one diffusion length of the P-N junction, the electron hole pair created by the absorption of the photon will merely recombine and release its energy as heat instead of contributing to the cell's electrical output. The term, "diffusion length" as used herein describes the mobility of a charge carrier which is generated by absorption of optical energy, i.e., incident light.

By way of example, the P-N junction in a typical solar cell is only 0.3 $\mu$m from the front surface of the cell, which for present purposes places the P-N junction virtually at the front surface. Thus, assuming that all of the light impinging the solar cell is absorbed within the first 75 $\mu$m below the front surface of the cell, so long as the diffusion length is 75 $\mu$m or more the cell can convert all of the electron hole pairs created by the absorption into electricity.

Radiation adversely effects the cell by damaging its crystal-line orderliness, resulting in a shortening of the distance that the electron-hole pair can travel, i.e., shortening the diffusion length. At a dosage of $1 \times 10^{16}$ MeV, the diffusion length of a 10 ohm-cm cell may be reduced to something on the order of 10 $\mu$m. Thus, the original cell with a useful collection region to a depth of 75 $\mu$m would have its collection region decreased to only about 10 $\mu$m, thus limiting the power output to that produced by light which is absorbed in the top 10 $\mu$m of the cell.

One way of attempting to alleviate the problem of radiation damage shortening the diffusion length of the cell is to bring the P-N junction closer to the region where the light is absorbed. This can be accomplished simply by placing the P-N junction deeper below the top surface of the cell. However, this solution creates a disadvantage because the response, i.e., output, of the cell to shorter wavelength light which is absorbed very close to the cell surface is lost.

Another approach to alleviating the problem of radiation effectively shortening the available diffusion length in a cell is the vertical junction cell approach. Vertical junction solar cells are formed by etching a plurality of parallel grooves in the top surface of the cell. The grooves define a corresponding plurality of walls each having a top and side surfaces. Typically, the grooves are etched to a depth of approximately 75–100 $\mu$m. With such a structure, light entering the cell at the top surface of the walls will most likely be entirely absorbed within the cell since the P-N junctions extend along the side surfaces of the walls as well as along the top surface of each wall, and these P-N junctions are within one diffusion length of the absorbed light even at reduced diffusion lengths so long as the distance between grooves, i.e., the wall width, is selected properly. However, light entering the grooves and impinging the cell at the bottom of the grooves is effectively the same as light which is absorbed in a planar cell at a depth well beyond the reduced diffusion length of a radiation damaged cell. Thus, most of the light entering the groove bottom is not absorbed in the cell within one diffusion length of a P-N junction and, therefore, does not contribute to the cell output.

Certain efforts to improve the efficiency of silicon solar cells have centered around two approaches. The first is the use of low resistivity silicon with a passivated front surface to significantly increase cell output voltage. The second is the use of high lifetime, textured cells with a back-surface-field (BSF). However, neither of these approaches are particularly effective where the solar cell is to be used in outer space because the efficiency improvements are negated by more severe radiation degradation encountered in the space environment. Specifically, low resistivity silicon exhibits a greater decrease in bulk diffusion length when subjected to particulate irradiation than higher resistivity silicon.

For higher resistivity silicon a BSF is necessary to achieve high efficiencies. However, BSF cells degrade more rapidly under irradiation. The use of a thinner solar cell may alleviate the degradation problem, but also results in reduced optical absorption. Thus, neither of these two approaches to increasing efficiency of the cells is well-adapted to high radiation environments such as space satellites.

SUMMARY OF THE INVENTION

Accordingly, it is an object of the present invention to provide an improved vertical junction solar cell which has an enhanced resistance to radiation degradation of the type particularly encountered in outer space applications. More specifically, it is an object of the present invention to provide an improved vertical junction solar cell structure wherein the incident light or radiation is directed toward the top surfaces of the walls of the vertical junction cell and away from the groove bottoms and ends.

Additional objects and advantages of the invention will be set forth in the description which follows, and in part will be obvious from the description, or may be learned by practice of the invention. The objects and advantages of the invention may be realized and attained by means of the instrumentalities and combinations particularly pointed out in the appended claims.

To achieve the foregoing objects, and in accordance with the purposes of the invention as embodied and broadly described herein, an improved vertical junction solar cell is provided. The vertical junction cell comprises a plurality of parallel grooves which are formed, by etching for example, in a silicon solar cell and are disposed normal to a front surface of the cell. The grooves define a plurality of walls each having a top surface and side surfaces extending from the top surface. Between each adjacent pair of walls is a groove bottom. A focusing coverslide means, disposed above the silicon solar cell, is provided for focusing incident light onto the top surfaces of the walls and away from the groove bottoms to thereby reduce the effect of radiation degradation of the solar cell.

The focusing coverslide means may comprise a plurality of cylindrical lenses for refracting incident light onto corresponding ones of the walls. Alternatively, the focusing coverslide means may comprise a plurality of fresnel lenses, or a plurality of troughs having mirrored side walls for reflecting incident light into corresponding ones of the walls.

BRIEF DESCRIPTION OF THE DRAWINGS

The accompanying drawings, which are incorporated in and constitute a part of the specification, illustrate presently preferred embodiments and, together with the general description given above and the detailed description given below, serve to explain the principals of the invention. In the drawings.

DESCRIPTION OF THE PREFERRED EMBODIMENTS

Figure 1:
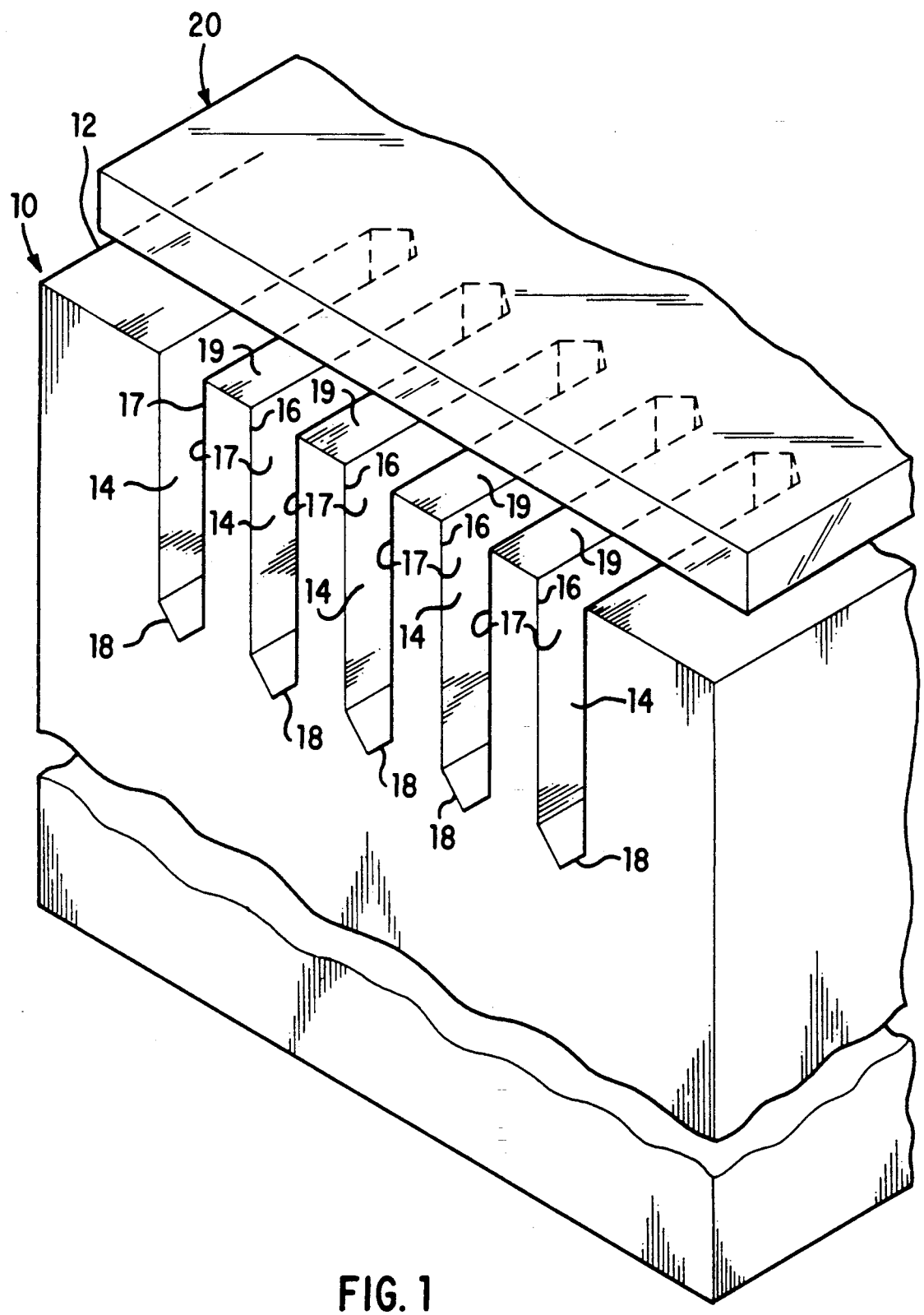
FIG. 1 is an isometric view of a vertical junction solar cell incorporating the present invention wherein the focusing coverslide is shown generally.

Reference will now be made in detail to the present preferred embodiments of the invention as illustrated in the accompanying drawings, in which like reference characters designate like or corresponding parts throughout the drawings.

A vertical junction solar cell designated 10 in FIG. 1 comprises a silicon wafer 12 which has a front surface upon which incident light or radiation impinges to thereby generate electrical current. Vertical junctions are formed in solar cell 10 by etching a plurality of grooves 14 in the front surface of the cell. Grooves 14 are preferably disposed parallel to each other and normal to the front surface of the solar cell, and define a plurality of walls 16. Walls 16 have top surfaces 19 and side surfaces 17. Groove bottoms 18 are formed between adjacent ones of walls 16.

The depth of grooves 14 is preferably selected to be a compromise between the surface area of top surfaces 19 and the total surface area of the cell because as the grooves are etched deeper, they are etched wider. Using present technologies, a groove depth of 75 $\mu$m is attainable without excessive groove widening. At such a depth, the walls may be formed with a width of about 20 $\mu$m, and the total combined surface area of the top surfaces 19 is about 90% of the total surface area of solar cell 10.

The inventor herein has analyzed data from radiation testing of vertical junction solar cells of the type illustrated in FIG. 1. That analysis indicates that radiation degradation of the vertical junction solar cell is caused almost entirely by a diminished efficiency in the collection of light which impinges on the non-walled portions of the solar cell, i.e., primarily groove bottoms 18. Very little if any diminished efficiency resulting from radiation degradation is experienced with the collection of light impinging top surfaces 19 of walls 16. Therefore, the inventor herein set forth to design a vertical junction solar cell wherein a maximum amount of the incident light is absorbed in top surfaces 19 of walls 16.

In order to accomplish the desired function of creating a vertical junction solar cell wherein substantially all of the incident light impinges on top surfaces 19 of walls 16, the cell is provided with focusing coverslide means for focusing the incident light onto the top surfaces of the walls and away from the groove bottoms.

Figure 2:
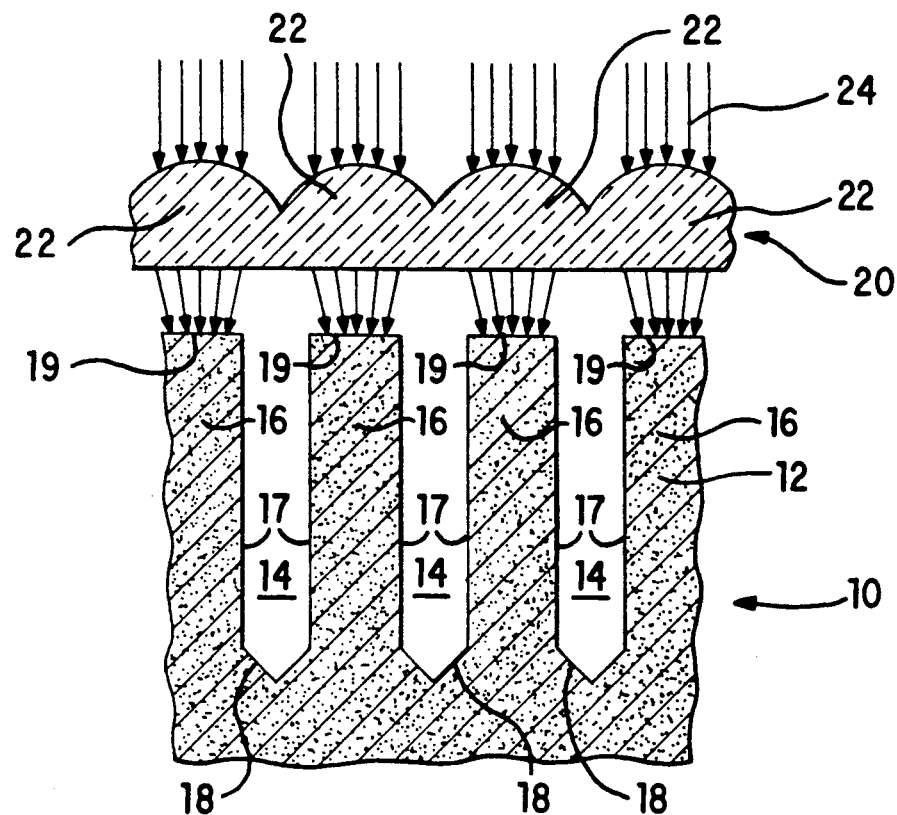
FIG. 2 is a partial side view of the vertical junction solar cell of FIG. 1 illustrating a first embodiment of the focusing coverslide.

As illustrated in FIG. 2, a first embodiment of the focusing coverslide means comprises a radiation transparent coverslide 20 comprised of a plurality of cylindrical lenses 22. Lenses 22 are aligned with respective ones of walls 16 and extend longitudinally on the coverslide to correspond to the length of walls 16.

As incident light, indicated by the arrowed lines 24, impinges the cylindrical surfaces of the lenses 22, the light is refracted such that it is directed onto top surfaces 19 of walls 16. This refraction of the incident light 24 is illustrated in FIG. 1 with the arrows emerging from the bottom of coverslide 20. As can be seen from the drawings, the cylindrical lenses comprising coverslide 20 function to direct all of the incident light 24 onto top surfaces 19 of walls 16 and away from groove bottoms 18. Because the groove bottoms are much more susceptible to radiation degradation than top surfaces 19, the present invention provides a vertical junction silicon solar cell which has greatly improved radiation degradation characteristics. This may be shown by way of example as discussed immediately below.

Without the use of focusing coverslide 20 and assuming that the top surfaces 19 comprise about 90% of the total surface area of the solar cell, approximately 90% of the incident light would impinge top surfaces 19 while the remaining 10% would impinge groove bottoms 18. Further assuming that top surfaces 19 absorb approximately 90% of the illumination incident thereon, the top surfaces of the walls would account for approximately 80% of the light absorbed by the cell (0.9 × 0.9 = 0.81) leaving 20% of the incident light to be absorbed by the bulk below bottoms 18 of grooves 14. However, with the addition of focusing coverslide 20 of the present invention, the 10% of incident light that would otherwise impinge grooved bottoms 18 instead impinges top surfaces 19 of the walls. Therefore, in a solar cell constructed in accordance with the embodiment of the invention illustrated in FIG. 2, top surfaces 19 account for 90% of the incident light absorbed by the solar cell leaving only 10% to be absorbed by the bulk below grooves 18. Thus, in theory, the present invention will reduce radiation degradation of vertical junction solar cells, by one-half.

Figure 3:
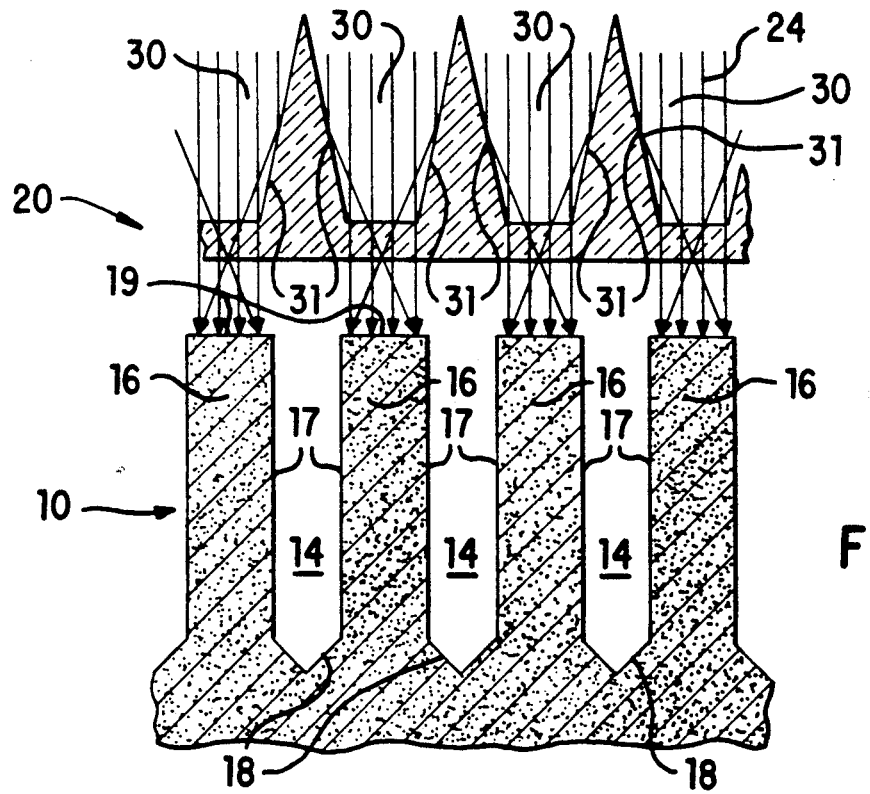
FIG. 3 is a partial side view of the vertical junction solar cell of FIG. 1 illustrating a second embodiment of the focusing coverslide.

In a second embodiment of the present invention, illustrated in FIG. 3, silicon solar cell 10 having grooves 14 and walls 16 is provided with a focusing coverslide 20 comprised of a plurality of troughs 30 which have mirrored side walls 31 for reflecting incident light 24 only onto top surfaces 19 of walls 16 and away from groove bottoms 18. The bottoms of troughs 30 are not mirrored so as to pass light therethrough. The overall effect of coverslide 20 comprised of the mirrored troughs 30 is identical to the coverslide comprised of the plurality of cylindrical lenses 22 except, of course, that the mirrored troughs reflect the incident light as opposed to refracting the incident light. Therefore, a solar cell constructed in accordance with the second embodiment of the invention will also, in theory, reduce radiation degradation by one-half.

Many other configurations for focusing coverslide 20 will now become apparent to those skilled in the art. In particular, the focusing coverslide 20 may comprise a plurality of fresnel lenses for refracting incident light onto the top surfaces of walls 16. Furthermore, where the present invention is to be used in outer space and will thus be subjected to more severe radiation impingement, coverslide 20 would preferably be composed of either ceria doped microsheet or an ultraviolet-coated fused quartz. which are more resistant to the extreme environmental conditions encountered in outer space.

Additional advantages and modifications will readily occur to those skilled in the art. Therefore, the invention in its broader aspects is not limited to the specific details, representative devices, and illustrative examples shown and described. Accordingly, departures may be made from such details without departing from the spirit or scope of the general inventive concept as defined by the appended claims and their equivalents.

What is claimed is:

1. An improved vertical junction solar cell, comprising:
   a silicon semiconductor body having a front surface;
   a plurality of parallel grooves formed in said front surface of said body and disposed normal to said front surface, said grooves defining a corresponding plurality of walls each having a top surface and side surfaces and a plurality of groove bottoms between adjacent ones of said walls at least one photoro Haic junction extending along the side and top surface of said walls; and
   focusing coverslide means for focusing incident light impinging the solar cell onto said top surfaces of the walls and away from said groove bottoms to thereby reduce radiation degradation of the solar cell.

2. The vertical junction solar cell of claim 1, wherein said focusing coverslide means comprises a plurality of cylindrical lenses respectively corresponding to said plurality of walls.

3. The vertical junction solar cell of claim 1, wherein said focusing coverslide means comprises a plurality of fresnel lenses respectively corresponding to said plurality of walls.

4. The vertical junction solar cell of claim 1, wherein said focusing coverslide means comprises a plurality of troughs having mirrored side walls for reflecting incident light onto corresponding ones of said top surfaces of said plurality of walls.

5. The vertical junction solar cell of claim 1, wherein said focusing coverslide means is composed of ceria doped microsheet.

6. The vertical junction solar cell of claim 1, wherein said focusing coverslide means is composed of UV-coated fused quartz.

7. The vertical junction solar cell of claim 1, wherein said grooves have a depth of about 75 $\mu$m and said walls have a width of about 20 $\mu$m.

8. The vertical junction solar cell of claim 1, wherein the total surface area of the top surfaces of said walls comprises about 90% of the front surface of said cell.

* * * * *

UNITED STATES PATENT AND TRADEMARK OFFICE
CERTIFICATE OF CORRECTION

PATENT NO. : 5,098,482
DATED : March 24, 1992
INVENTOR(S) : Donald B. Warfield

It is certified that error appears in the above-identified patent and that said Letters Patent is hereby corrected as shown below:

Column 5, line 24, "photoro Haic junction" should read --photovoltaic junction--.

Signed and Sealed this

Fifteenth Day of June, 1993

Attest:

MICHAEL K. KIRK

Attesting Officer

Acting Commissioner of Patents and Trademarks